US007333908B2

United States Patent
Johnson

(10) Patent No.: US 7,333,908 B2
(45) Date of Patent: Feb. 19, 2008

(54) TECHNIQUES FOR GENERATING TEST PATTERNS IN HIGH SPEED MEMORY DEVICES

(75) Inventor: James Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,992

(22) Filed: Sep. 1, 2005

(65) Prior Publication Data

US 2007/0050167 A1  Mar. 1, 2007

(51) Int. Cl.
   *G01R 31/00* (2006.01)
(52) U.S. Cl. .............. 702/120; 702/107; 702/117
(58) Field of Classification Search ........... 702/120, 702/117, 107; 365/201, 191, 198, 220, 221
   See application file for complete search history.

(56) References Cited

U.S. PATENT DOCUMENTS

| 6,430,696 | B1 | 8/2002 | Keeth |
| 6,662,304 | B2 | 12/2003 | Keeth et al. |
| 6,799,290 | B1 * | 9/2004 | Kirihata et al. ............ 714/719 |
| 6,889,357 | B1 | 5/2005 | Keeth et al. |
| 2003/0163720 | A1 * | 8/2003 | Shutoku et al. ............ 713/193 |
| 2005/0195677 | A1 * | 9/2005 | Salmon et al. ......... 365/230.06 |

* cited by examiner

*Primary Examiner*—John Barlow
*Assistant Examiner*—Jonathan Moffat
(74) *Attorney, Agent, or Firm*—Fletcher Yoder

(57) ABSTRACT

A system and methods for calibrating a memory device are provided. More specifically, a technique for internally generating a test pattern within a memory device and driving the test pattern to a memory controller for synchronization and calibration is provided. An internal test pattern may be generated along the write bus within a memory device, employing elements already present for high speed memory devices. The test data may be looped back from the write bus to the read bus and transmitted to the memory controller for calibration. The loop back function may be implemented without accessing the memory array.

20 Claims, 5 Drawing Sheets

FIG. 5
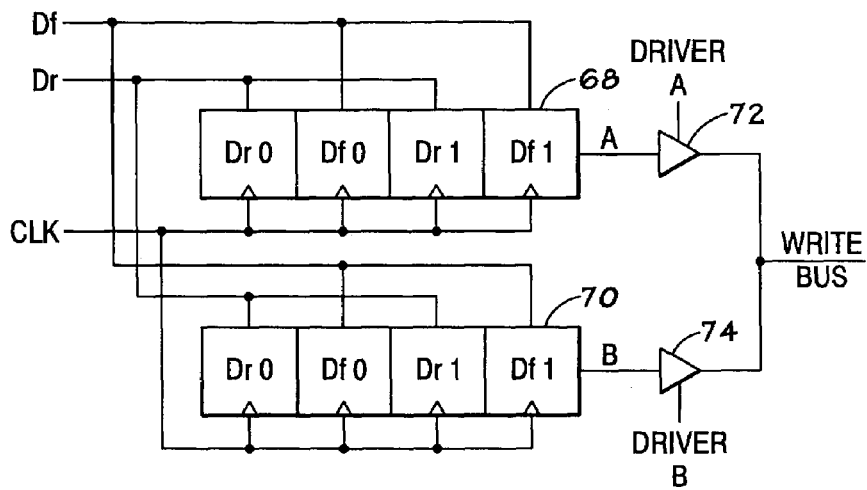
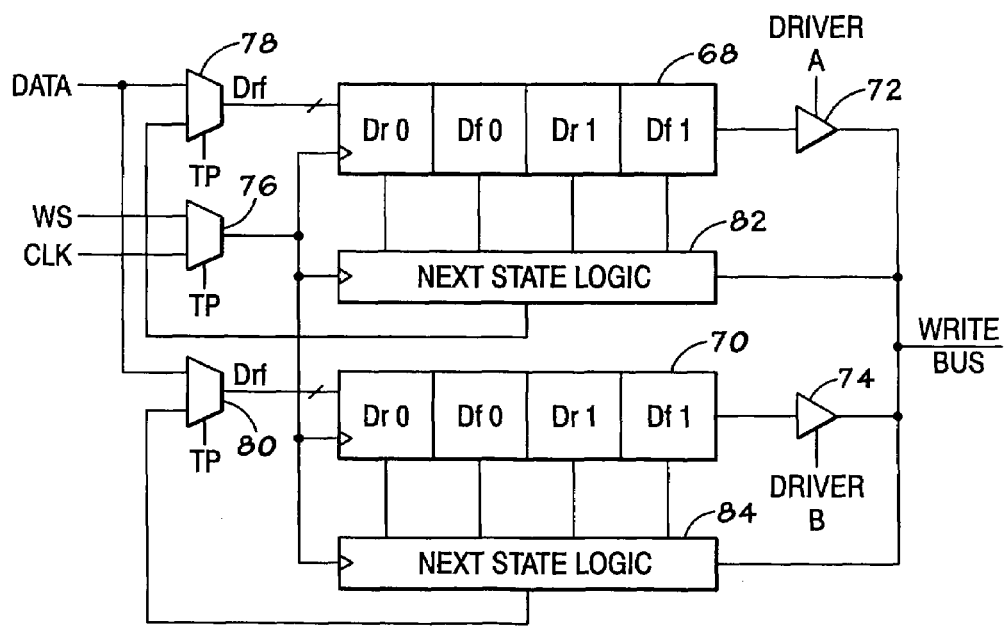
FIG. 6

TECHNIQUES FOR GENERATING TEST PATTERNS IN HIGH SPEED MEMORY DEVICES

BACKGROUND OF THE INVENTION

1. Field of the Invention

The present invention relates generally to high speed memory devices, and more specifically, to techniques for initializing and calibrating controllers in high speed memory devices.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's complex computer systems, speed, flexibility, and reliability in timing control are issues typically considered by design engineers tasked with meeting customer requirements while implementing innovations which are constantly being developed for the computer systems and their components. Computer systems typically include a memory sub-system which includes a memory array and one or more memory controllers which provide access to the memory array. The memory array generally includes a plurality of memory devices which may be used to store programs and data and may be accessible to other system components such as processors or peripheral devices through the memory controller. Typically, memory devices are grouped together to form memory modules, such as dual-inline memory modules (DIMMs). Computer systems may incorporate numerous modules to increase the storage capacity in the system.

Each read request to the memory array has an associated read latency period corresponding to the interval of time between the initiation of a read request from a requesting device, such as a processor, and the time the requested data is delivered to the requesting device. Similarly, for each write request to the memory array, there is a write latency corresponding to the time it takes from the initiation of a write request to be initiated by a requesting device and the data to be written to the memory. A memory controller may be tasked with coordinating the exchange of requests and data in the system between requesting devices and each memory device such that timing parameters, such as latency, are considered to ensure that requests and data are not corrupted by overlapping requests and information.

During initialization of the memory sub-system, latency periods are set to insure proper communication and data exchange between the memory array and the memory controller. During initialization, alignment of read data access in accordance with read latency, as well as alignment of write data access in accordance with write latency is set (i.e., the sub-system is calibrated). Calibrating the memory sub-system upon initialization or system reset introduces a number of design challenges. To test and calibrate the memory controller to ensure proper data exchange, test patterns are often generated and sent to and from the memory array through the array controller. Often, these test patterns are provided by components external to the memory sub-system. However, the external transmission of data patterns may be disadvantageous in certain applications.

The present invention may address one or more of the concerns set forth above.

BRIEF DESCRIPTION OF THE DRAWINGS

The foregoing and other advantages of the invention will become apparent upon reading the following detailed description and upon reference to the drawings in which:

FIG. 5 illustrates shift registers of a serial-to-parallel converter;

FIG. 6 illustrates shift registers of a serial-to-parallel converter which may be implemented for generating a test pattern, in accordance with embodiments of the present invention;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
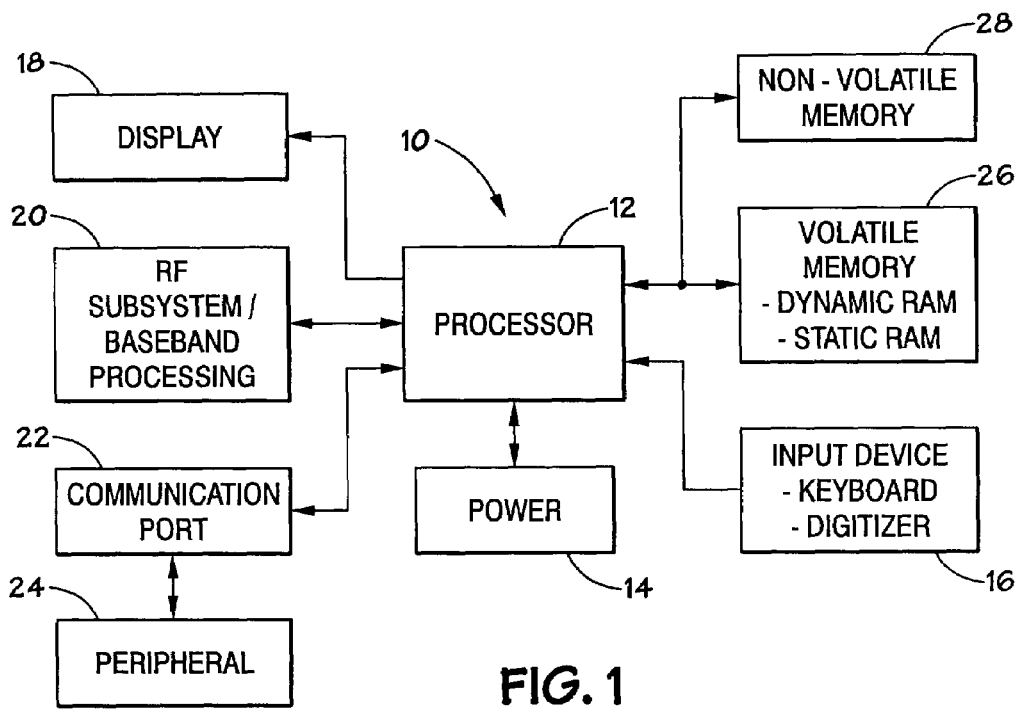
FIG. 1 is a block diagram illustrating an exemplary processor-based system which may incorporate a memory sub-system configured in accordance with embodiments of the present invention.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors which share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Generally, the processor 12 controls the functioning of the system 10 by implementing software programs. The memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
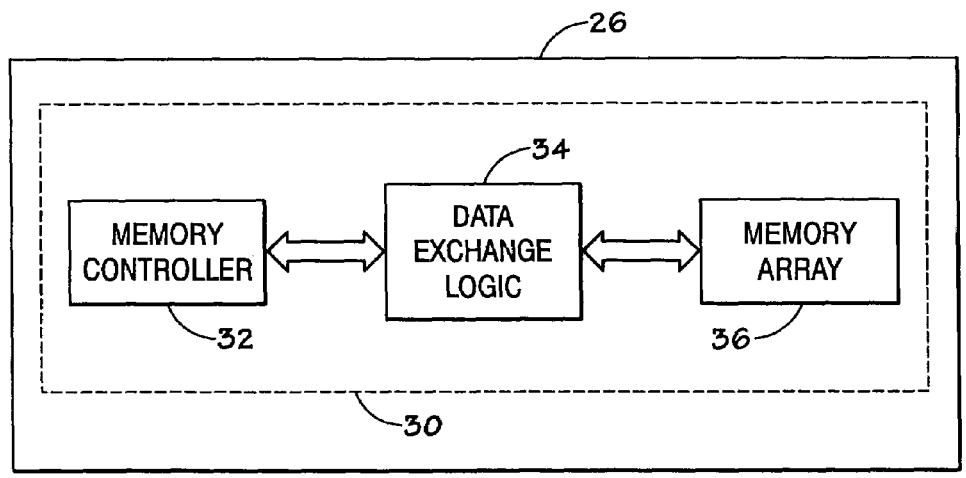
FIG. 2 is a block diagram illustrating an exemplary memory sub-system configured in accordance with embodiments of the present invention.

FIG. 2 illustrates a block diagram of a memory sub-system 30, which may be included in the volatile memory 26. As illustrated in FIG. 2, the memory sub-system 30 includes a memory controller 32, data exchange logic 34 and a memory array 36. The memory array 36 may include a number of memory modules, such as dual inline memory modules (DIMMs), each including a plurality of memory devices such as Dynamic Random Access Memory (DRAM) devices. The memory controller 32 provides access to the memory array 36 (through the data exchange logic 34). That is, the memory controller 32 is configured to receive memory requests from other devices in the system 10, such as the processor 12 or peripheral devices 24, and facilitate the execution of the requests and the exchange of information to and from the memory array 36. The data exchange logic 34 generally provides the additional logic necessary for transferring the requested data to and from the memory array 36. The data exchange logic 34 may include a number of elements, such as row and column decoders, address buffers, sense amplifiers, word line drivers, write drivers, read logic, data amplifiers, such as helper flip flops, data latches, etc. As will be appreciated, these elements are employed facilitate the exchange of information between the memory controller 32 and the memory array 36.

Generally, high speed dynamic random access memory (DRAM) devices require throughput matching pipelines to align read data access with read latency requirements according to established worst case array access timing. In other words, if power voltage temperature (PVT) conditions create fast access conditions for the memory array 36, and latency requirements cause several array column access cycles to occur before programmed read latency expires, then a pipeline to store array accesses is generally included in the data path to store continuous data from the memory array 36. Likewise, if PVT conditions cause slow accesses, the forward latency of the pipeline must be short to ensure data arrives at the outputs before the program latency expires. Thus, the data pipeline matches the throughput of the array with the programmed latency. The programmed latency is a fixed time based on the worst case array access latency.

Figure 3:
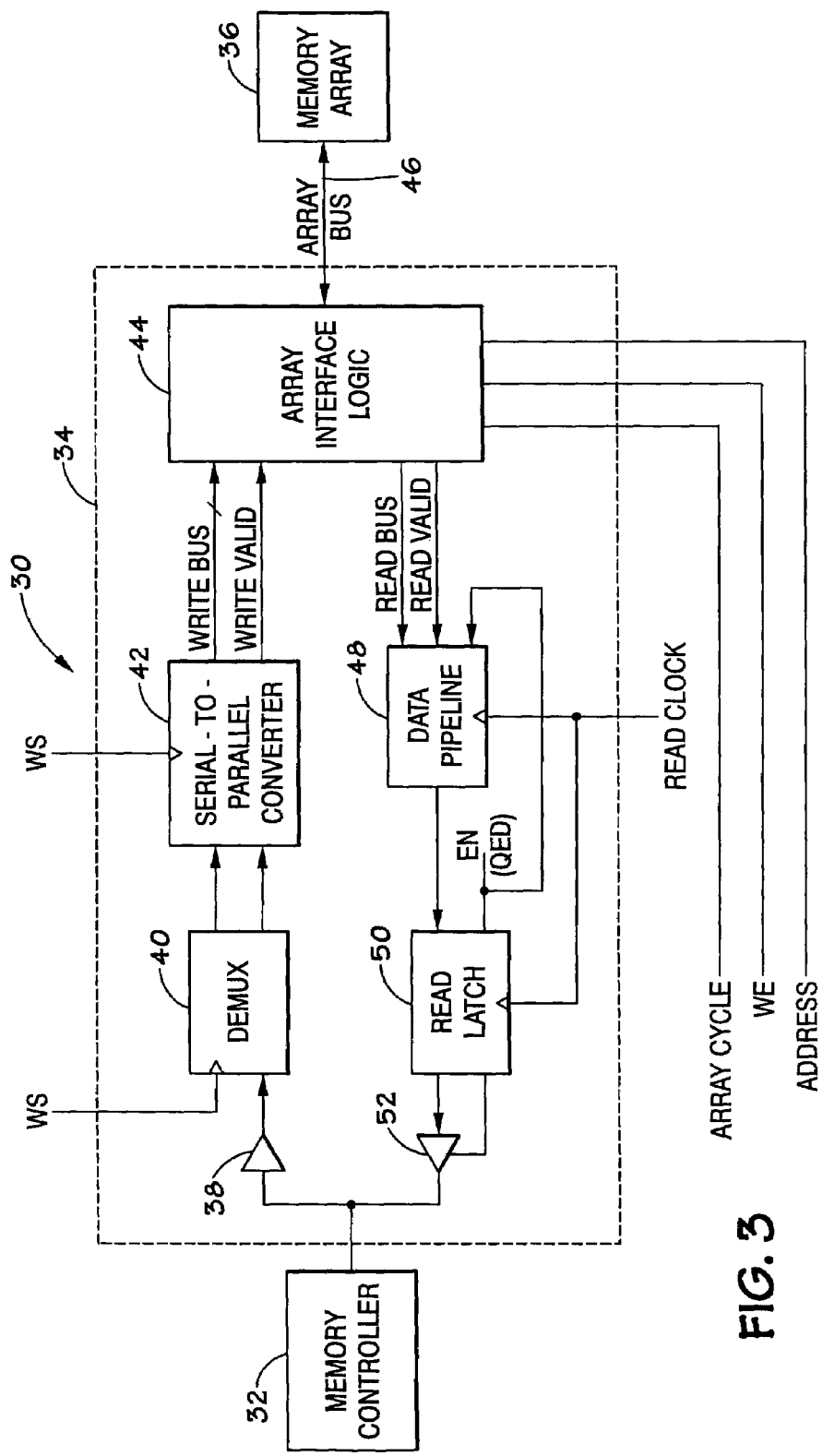
FIG. 3 is a block diagram illustrating data exchange logic of the memory sub-system of FIG. 2 configured in accordance with embodiments of the present invention.

Turning now to FIG. 3, a block diagram of a portion of the memory sub-system 30 is illustrated. As will be described further below, the components of the memory sub-system 30 may be configured such that the memory sub-system 30 can generate its own calibration patterns such that the channel between the memory controller 32 and the memory array 36 may be tested and calibrated. As will be described further below, in accordance with embodiments of the present invention, the data exchange logic 34 is configured to internally generate test patterns, send the test patterns along the write bus, loop the test patterns back onto the read bus, and finally send the test patterns to the external memory controller 32 such that timing parameters may be adjusted based on the test pattern. Generating the test patterns internal to the memory sub-system 30 may be advantageous in certain applications. Further, by using existing logic and data buses within the memory sub-system 30 to generate, route and transmit the test patterns to the memory controller 32, little additional space on the die or system board is necessary.

Referring specifically to FIG. 3, the data exchange logic 34 includes each of a write data path and a read data path arranged between the memory controller 32 and the memory array 36. The write data path allows data from an external device such as the processor 12 to write data to the memory array 36. Similarly, the read data path allows data to be read from the memory array 36 and sent to an external requesting device. More specifically, the write data path includes a receiver 38 configured to receive write data from the memory controller 32. Because of speed variations between the data being transmitted from the receiver 38 and the timing requirement necessary to write data to the memory array 36, a demultiplexer 40 may be provided in the write data path to receive write data from the receiver 38 and to transmit it at a slower speed. The demultiplexer 40 is configured to latch data with the write strobe (WS) signal. The WS signal is typically used in source-synchronous DRAMs, as may be implemented here. The write data is latched from the demultiplexer 40 to the serial-to-parallel converter 42 such that the data throughput can be deserialized and slowed. Exemplary aspects of the serial-to-parallel converter 42 will be described and illustrated with reference to FIGS. 5 and 6 below. The write data is transmitted from the serial-to-parallel converter 42 along the write bus to the array interface logic 44 (described further below with reference to FIG. 4) and to the memory array 36 through the array bus 46. As will be appreciated, in the present exemplary embodiment, the array bus 46 is a bidirectional data bus configured to carry data to and from the memory array 36.

As will be appreciated by those skilled in the art, and as described further below with respect to FIG. 4, the array interface logic 44 receives a number of control signals, such as an array cycle signal, a write enable signal and address signals. The array cycle signal initiates all read and write accesses to the memory array 36. This signal is valid following a decode of a read access or following the deserialization (serial-to-parallel converter 42) of write data subsequent to a write access. The write enable (WE) signal accompanies a valid array cycle to indicate to the array interface logic 44 whether the current array access is a read or a write. The address signal is a signal bus of column addresses timed to transition with the array cycle signal for addressing the memory array 36.

The read data path is provided to direct data from the memory array 36 to the memory controller 32. Thus, data is sent from the memory array 36 along the bi-directional array bus 46 and to the array interface logic 44. Data is sent from the array interface logic 44 along the read bus to the data pipeline 48. As discussed further below, the array interface logic 44 includes a plurality of helper flip-flops configured to convert rail-to-rail voltages. The data pipeline 48 is essentially a first in first out (FIFO) storage device that mitigates the throughput between the output timing requirements and the array access time. The data read path also includes a read latch 50 configured to latch the read data to the data driver 52 for transmission to the memory controller 32.

As previously described, during initialization, test data patterns are generally sent from an external device through the memory controller 32 and through the data exchange logic 34 to the memory array 36 and from the memory array 36 through the data exchange logic 34 and to the memory controller 32 such that timing adjustments can be made at the memory controller 32. In accordance with embodiments of the present invention, the serial-to-parallel converter 42 may be configured to internally generate test patterns which may be used to calibrate the memory controller 32. To achieve this and as described further below, the array interface logic 44 may be configured to provide a loop back function to loop the test patterns internally generated at the serial-to-parallel converter 42 back through the read data path and to the memory controller 32. Advantageously, by embedding logic in the serial-to-parallel converter 42, test pattern generation is implemented with minimal area impact on the memory sub-system 30. By combining the embedded pattern generation logic with the loop back function to drive predetermined data patterns from the serial-to-parallel converter 42 into the read data pipeline 48, the generation of test patterns and synchronization and calibration of the memory controller 32 is simplified by using existing logic and data path bussing to perform the synchronization.

Figure 4:
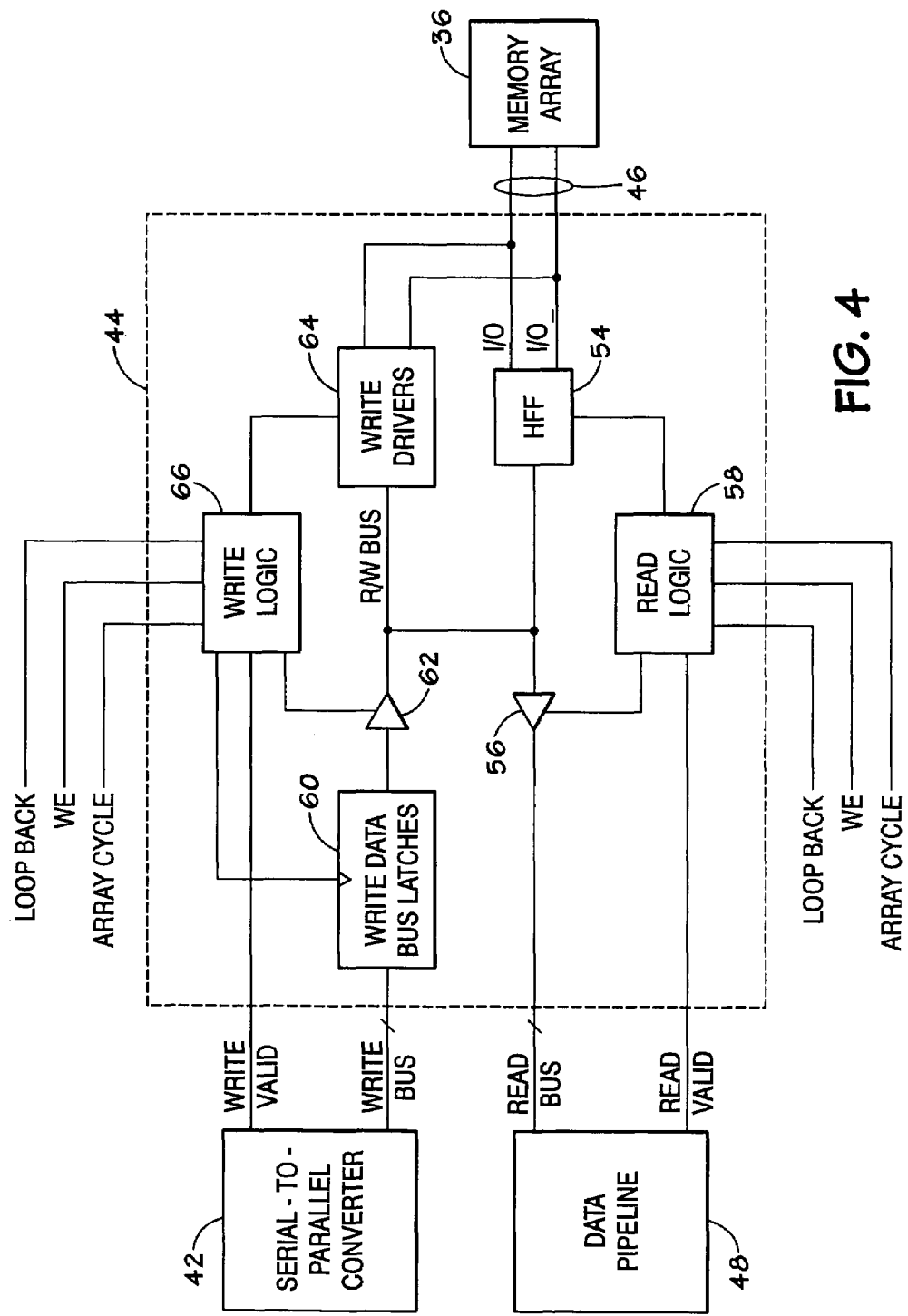
FIG. 4 is a block diagram illustrating array interface logic of the data exchange logic of FIG. 4 configured in accordance with embodiments of the present invention.
Figure 8:
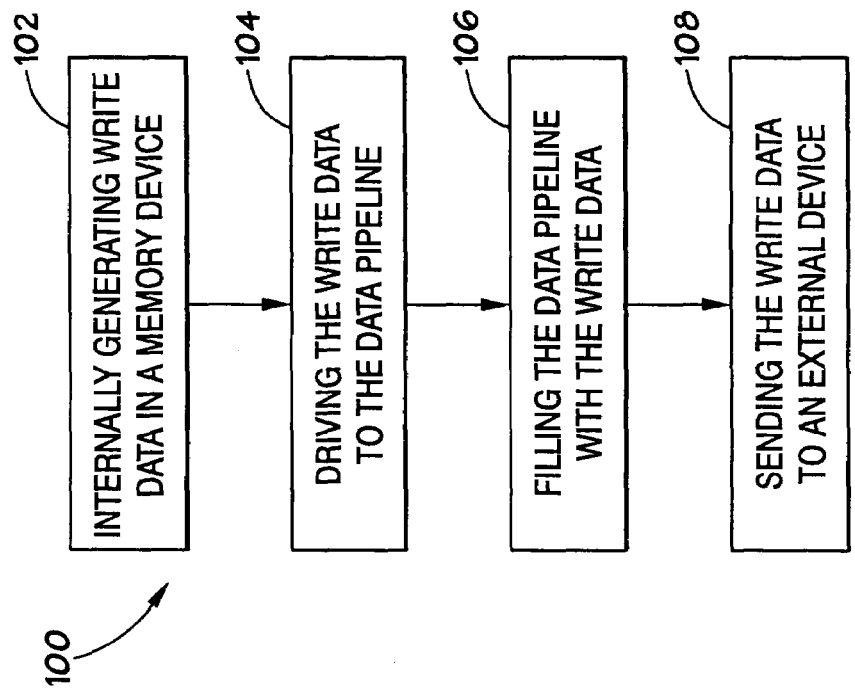
FIG. 8 is a flow chart illustrating an exemplary calibration method in accordance with further embodiments of the present invention.
Figure 7:
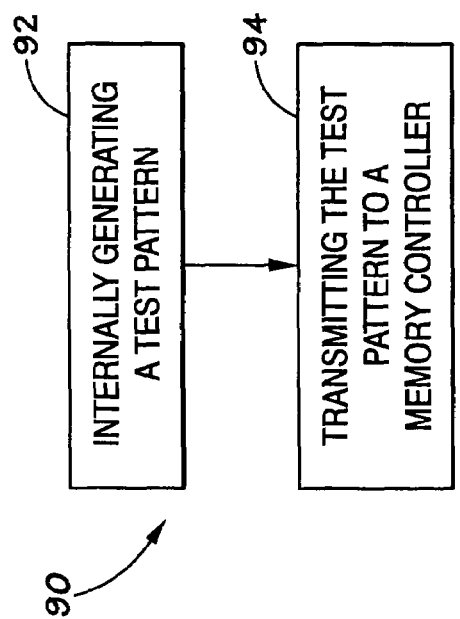
FIG. 7 is a flow chart illustrating an exemplary calibration method in accordance with embodiments of the present invention.

As described further below, FIG. 4 is a block diagram of the array interface logic 44 which is used to illustrate the loop back function which may be implemented in accordance with embodiments of the present invention. FIGS. 5 and 6 illustrate the test pattern generation in the serial-to-parallel converter 42 which may be used in conjunction with the loop back function in accordance with embodiments of the present invention. Finally, FIGS. 7 and 8 are flow charts illustrating synchronization methods in accordance with embodiments of the present invention.

Referring now to FIG. 4, a block diagram of the array interface logic 44 is illustrated. For a read transaction in a non-loop back function (i.e., access is provided to the memory array 36), the array interface logic 44 facilitates a typical read operation by allowing data from the memory array 36 to be sent through the array interface logic 44 along the read bus and data pipeline 48 and eventually to the memory controller 32. During the non-loop back function, the memory array 36 is read following a successful word line activation and column selection. The helper flip-flop (HFF) block 54 is used to restore CMOS logic voltage levels from the detected small-signal voltage difference on the complimentary lines I/O and I/O_of the array bus 46. The read bus driver 56 is implemented, because the HFF circuit 54 cannot drive the large parasitic capacitance of the read bus. Read logic 58 is also employed to facilitate a read operation, as discussed further below.

For a write transaction in a non-loop back function array access, the write data bus latches 60 are employed to latch the write data driven from the serial-to-parallel converter 42. Data is then driven onto the R/W bus by the R/W bus driver 62. The write drivers 64 are then activated to overwrite the sense amplifiers in the memory array 36 by driving the I/O and I/O_bus. As will be appreciated, write logic 66 may also be included to direct certain write functions. For instance, the write logic 66 may be configured to receive control signals such as the array cycle, the write enable (WE) signal, the loopback control signal and the write valid control signal.

The write strobe (WS) signal is used in source-synchronous DRAM interfaces and is center-aligned with the data clock. The write valid signal indicates when a full deserialization of a write access has occurred. The read valid control signal is generated in the array interface logic 44 to indicate when read data is available from the memory array 36. The array cycle signal initiates all read and write accesses to the memory array 36. This signal is valid following a decode of a read access or following the deserialization of write data subsequent to a write access. The write enable (WE) signal accompanies a valid array cycle to indicate to the array interface logic 44 whether the current array access is a read or a write. The loopback control signal is provided to initialize the loopback feature and to trigger suppression of access to the memory array 36. This will allow for the looping of the test data patterns generated internally in the memory sub-system 30 to be sent from the write bus to the read bus and on to the memory controller 32, as described further below.

When a loopback signal is sent to the array interface logic 44, a loop back function is initiated. For the loop back function, all activation of operations on the IO and IO_bus are suppressed. This assures that any array data is not corrupted in case data must be maintained in the memory array 36. The read data logic 58 and write data logic 66 is implemented such that the loopback signal forces the array cycle signal to cycle a write onto the R/W bus with a subsequent read initiated from the R/W bus to the read bus. The read valid signal is also strobed forcing a direct load of the written data to the data pipeline 48. This cycle is repeated for each write command until the data pipeline 48 is full. Subsequently, read commands are issued to the device with the array cycle signal suppressed by the loopback signal. The read command is repeated until the data pipeline 48 is emptied. All signals controlling read latency and IO circuits function normally as though a read to the memory array 36 has been requested. The loopback signal can be applied through a special test key implemented during manufacture and test of the device or made public to the end user through a DRAM mode register load command for instance.

Thus, the loop back function provides a mechanism for looping any data through the data exchange logic 34 such that data can be sent on the read bus and the write bus. With this in mind, the serial-to-parallel converter 42 on the write bus may be implemented to generate internal test patterns such that the test patterns may be looped back through the array interface logic 44, along the read bus, through the data pipeline 48, and to the memory controller 32. As will be appreciated, different specifications and customer requirements may require different pattern generation and sequencing. The type of pattern generation required is not critical to the present techniques. What is important to note is that the present techniques provide a mechanism for generating any type of test pattern required, and generating that test pattern internal to the memory sub-system 30 and more specifically, internal to the data exchange logic 34.

As previously described, the serial-to-parallel converter 42 may be employed to generate a test pattern. Advantageously, the test pattern is generated internally in the memory sub-system 30, rather than externally in another portion of the system 10. FIG. 5 illustrates a portion of the serial-to-parallel converter 42. The serial-to-parallel converter 42 includes shift registers 68 and 70. Because the serial-to-parallel converter 42 is generally employed to perform a serial shift/parallel unload function, much of the circuitry can be reused for the pattern generation with only a minimal addition of logic, as will be illustrated with reference to FIG. 6 below. Referring now to FIG. 5, the data going into the serial-to-parallel converter 42 is split into rising clock edge data (Dr) and falling clock edge data (Df) and driven onto two data paths A and B. The incoming data is captured in each storage latch of the shift registers 68 and 70 and the DrvA and DrvB signals are timed to coincide with receipt of the last bit in a fixed length data burst. The data on data path A is driven by a driver 72 while the data on data path B is driven onto the write bus by driver 74. The data is driven to a subsequent set of data latches (not shown) before it is written to the memory array 36. While data is driven from group A, group B is made available for conversion of subsequent incoming data. Logic is implemented to "ping-pong" between these shift registers 68 and 70 so that one register (e.g., register 68) is allowed to drive data on the write bus while the opposing register (e.g., register 70) captures new data.

Referring now to FIG. 6, serial-to-parallel converter 42 with the test pattern generation logic added to the shift registers of FIG. 5 is illustrated. As will be appreciated, the clock used to deserialize the data is generally provided by the write strobe (WS). However, for test pattern generation, a continuous clock CLK provided by the system clock or a DLL driven clock can be multiplexed so as to provide a clock source for continuously clocking the serial-to-parallel converter 42. As illustrated in FIG. 6, the multiplexer 76 receives the write strobe (WS) signal as well as the system clock (CLK). The test pattern (TP) signal can be used such that the multiplexers 76, 78 and 80 may be toggled between generating internal test pattern data and receiving external data from the memory controller 32 or from the memory array 36. The next state logic 82 and 84 is used to track the previous state on the data pipeline 48 such that a determination can be made as to what next to drive onto the data pipeline 48. The test pattern generator can drive data identically as write data would be driven. Logic is added to the peripheral logic for generating high/low signals such as enable (En(QED)) for controlling output circuits as well as enabling control logic in the data pipeline 48. Because the write data deserialization logic (i.e., serial-to-parallel converter 42) will run continuously in the test pattern generation mode of operation, the loop back function will also run continuously. Therefore, any desired test pattern that can be generated by the available shift registers 68 and 70 normally required in high performance memory applications, can be generated and driven on the existing logic required for the memory device operation. This saves additional area that might otherwise be required for dedicated test pattern generation logic.

Referring now to FIG. 7, an exemplary flowchart 90 is provided to illustrate exemplary embodiments of the present technique. That is, the flow chart 90 illustrates an exemplary calibration method in accordance with embodiments of the present invention. First, a test pattern is generated internal to the memory sub-system 30, as indicated in block 92. More specifically, in accordance with one embodiment, the serial-to-parallel converter 42, generally employed in the write path of high speed memory devices, may be used to generate a test pattern for synchronization of the memory controller 32. Once the test pattern is generated internally, the test pattern may be transmitted to the memory controller 32, as indicated in block 94. In accordance with one exemplary embodiment, if the test pattern is generated along the write path (e.g., in the serial-to-parallel converter 42), a loop back function may be employed to prevent the test pattern from being written to the memory array 36. Instead, the test pattern may be looped back onto the read bus and driven out to the memory controller 32 such that timing and/or voltage can be calibrated at the memory controller 32.

FIG. 8 is another exemplary flow chart 100, provided to illustrate a more specific embodiment of the present techniques. In accordance with the calibration method illustrated in the flow chart 100, write data is internally generated with a memory device, such as a DRAM, as indicated in block 102. The write data may be internally generated along the write bus and may be employed as a test pattern. Next, the write data is driven to the data pipeline 48 on the read bus, as indicated in block 104. In accordance with this exemplary embodiment, and as discussed above, a loop back function may be employed to prevent the write data from being written to the memory array 36. Instead, the write data may be looped back onto the read bus. As write data is generated and driven to the read data pipeline 48, the read data pipeline 48 is filled, as indicated in block 106, and the read data path is enabled such that the data generated in the serial-to-parallel converter 42 is driven to an external device, as indicated in block 108. In this sense, the loopback function is enabled to run continuously as the read logic 58 generates the read valid signal following successful test pattern generation in the serial-to-parallel converter 42. In accordance with one exemplary embodiment, the external device may be the memory controller 32 and the write data may be employed to calibrate the memory controller 32.

While the calibration techniques described herein have been described as being employed upon initialization of the memory sub-system, it should be understood that the calibration techniques may also be initiated periodically by the memory controller 32. In this way, the system can be re-calibrated periodically or as needed. Further, either timing or voltage (or both) calibration may be applied in accordance with embodiments of the present techniques. In one embodiment, internal reference voltage (Vref) may be calibrated in accordance with the present techniques.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
   a memory array;
   a memory controller; and
   data exchange logic coupled between the memory array and the memory controller, wherein the data exchange logic is configured to facilitate an exchange of data between the memory array and the memory controller, and further configured to operate in a test mode wherein the data exchange logic internally generates a test pattern and transmits the internally generated test pattern to the memory controller when the data exchange logic is in the test mode, wherein the data exchange logic comprises a serial-to-parallel converter configured to transmit write data from the memory controller to the memory array and further configured to generate the test pattern, and configured to loop data from a write bus in the data exchange logic to a read bus in the data exchange logic, without accessing the memory array while the data exchange logic is in the test mode.

2. The system, as set forth in claim 1, wherein the data exchange logic comprises array interface logic configured to transmit write data from the memory controller to the memory array and to transmit read data from the memory array to the memory controller, and configured to suppress transmission of data to the memory array while the data exchange logic is in the test mode.

3. The system, as set forth in claim 1, wherein the data exchange logic is configured to operate in the test mode upon initialization of the system.

4. The system, as set forth in claim 1, wherein the memory controller is calibrated when the data exchange logic is in the test mode.

5. A calibration method comprising:
   internally generating a test pattern within a memory sub-system, wherein internally generating a test pattern comprises generating a test pattern in a serial-to-parallel converter in data exchange logic arranged between a memory controller and a memory array, wherein the data exchange logic is configured to facilitate an exchange of data between the memory controller and the memory array;
   transmitting the test pattern to a memory controller; and
   looping back the test pattern from a write bus internal to the memory sub-system to a read bus internal to the memory sub-system before transmitting the test pattern to the memory controller.

6. The calibration method, as set forth in claim 5, wherein internally generating the test pattern and transmitting the test pattern occur during initialization of the memory sub-system.

7. The calibration method, as set forth in claim 5, wherein internally generating the test pattern and transmitting the test pattern occur based on a request from the memory controller.

8. The calibration method, as set forth in claim 5, wherein the calibration method is employed to initialize voltage or timing variables in the memory controller.

9. A memory sub-system comprising:
   a memory controller;
   a memory array;
   a write data path for transmitting data from the memory controller to the memory array, wherein the write data path comprises a serial-to-parallel converter configured to match write data throughput based on memory array access speed and further configured to generate the test pattern;
   a read data path for transmitting data from the memory array to the memory controller, wherein the memory sub-system is configured to internally generate a test pattern on the write data path and to transmit the test pattern to the memory controller on the read data path without accessing the memory array; and
   array interface logic configured to transmit the data to and from the memory array and further configured to receive the test pattern from the write data path and to transmit the test pattern to the read data path without accessing the memory array.

10. A memory sub-system, comprising:
    a memory controller;
    a memory array;
    a write data path for transmitting data from the memory controller to the memory array, wherein the write data path comprises a serial-to-parallel converter configured to match write data throughput based on memory array access speed and further configured to generate the test pattern; and
    a read data path for transmitting data from the memory array to the memory controller, wherein the memory sub-system is configured to internally generate a test pattern on the write data path and to transmit the test pattern to the memory controller on the read data path without accessing the memory array; and
    wherein the write data path comprises:
       a receiver configured to receive data from the memory controller;
       a demultiplexer configured to receive the data from the receiver;
       a serial-to-parallel converter configured to match write data throughput based on memory array access speed and further configured to generate the test pattern; and
       array interface logic configured to transmit the data to the memory array and further configured to transmit the test pattern to the read data path, without accessing the memory array.

11. A memory sub-system, comprising:
    a memory controller;
    a memory array;
    a write data path for transmitting data from the memory controller to the memory array, wherein the write data path comprises a serial-to-parallel converter configured to match write data throughput based on memory array access speed and further configured to generate the test pattern; and
    a read data path for transmitting data from the memory array to the memory controller, wherein the memory sub-system is configured to internally generate a test pattern on the write data path and to transmit the test pattern to the memory controller on the read data path without accessing the memory array; and
    wherein the write data path comprises:
       array interface logic configured to receive the data from the memory array and further configured to receive the test pattern from the write bus;
       a data pipeline comprising a storage device configured to receive the data from the array interface logic and further configured to receive the test pattern from the array interface logic;
       a latch configured to receive the data from the data pipeline and further configured to receive the test pattern from the data pipeline; and a driver configured to transmit the data from the latch to the memory controller and further configured to transmit the test pattern from the latch to the memory controller.

12. A calibration method comprising:
internally generating write data in a memory device, wherein internally generating write data comprises internally generating a test pattern using a serial-to-parallel converter, and looping back the test pattern from a write bus internal to the memory device to a read bus internal to the memory device before transmitting the test pattern to an external device;
driving the write data to a data pipeline;
filling the data pipeline with the write data; and
sending the write data from the memory device to the external device.

13. The calibration method, as set forth in claim 12, wherein internally generating comprises internally generating write data in a dynamic random access memory device (DRAM).

14. The calibration method, as set forth in claim 12, wherein sending the write data comprises sending the write data from the memory device to a memory controller.

15. The calibration method, as set forth in claim 12, wherein the method is performed without accessing a memory away in the memory device.

16. The calibration method, as set forth in claim 12, wherein the method is performed without utilizing any driver logic except driver logic implemented for accessing the memory array.

17. The calibration method, as set forth in claim 12, wherein the method is performed upon initialization of the memory device or upon request by the memory controller.

18. A system comprising:
a memory array;
a memory controller; and
data exchange logic coupled between the memory array and the memory controller, wherein the data exchange logic is configured to facilitate an exchange of data between the memory array and the memory controller, and further configured to operate in a test mode wherein the data exchange logic internally generates a test pattern and transmits the internally generated test pattern to the memory controller when the data exchange logic is in the test mode, wherein the data exchange logic comprises array interface logic configured to transmit write data from the memory controller to the memory array and to transmit read data from the memory array to the memory controller, and further configured to loop data from a write bus in the data exchange logic to a read bus in the data exchange logic, without accessing the memory array while the data exchange logic is in the test mode; and further configured to suppress transmission of data to the memory array while the data exchange logic is in the test.

19. A calibration method comprising:
internally generating a test pattern within a memory sub-system;
transmitting the test pattern to a memory controller; and
looping back the test pattern from a write bus internal to the memory sub-system to a read bus internal to the memory sub-system before transmitting the test pattern to the memory controller and without accessing memory array internal to the memory sub-system.

20. A memory sub-system comprising:
a memory controller;
a memory array;
a write data path for transmitting data from the memory controller to the memory array;
a read data path for transmitting data from the memory array to the memory controller, wherein the memory sub-system is configured to internally generate a test pattern on the write data path and to transmit the test pattern to the memory controller on the read data path without accessing the memory array; and
array interface logic configured to transmit the data to and from the memory array and further configured to receive the test pattern from the write data path and to transmit the test pattern to the read data path without accessing the memory array.

* * * * *

UNITED STATES PATENT AND TRADEMARK OFFICE
CERTIFICATE OF CORRECTION

PATENT NO. : 7,333,908 B2 Page 1 of 1
APPLICATION NO. : 11/218992
DATED : February 19, 2008
INVENTOR(S) : Johnson It is certified that error appears in the above-identified patent and that said Letters Patent is hereby corrected as shown below:

In column 9, line 26, in Claim 2, after "and" insert -- further --.

In column 11, line 26, in Claim 15, delete "away" and insert -- array --, therefor.

Signed and Sealed this

Twenty-seventh Day of May, 2008

JON W. DUDAS
*Director of the United States Patent and Trademark Office*